(12) United States Patent
Komatsu

(10) Patent No.: US 7,463,025 B2
(45) Date of Patent: Dec. 9, 2008

(54) INDUCED MAGNETIC FIELD DETECTING APPARATUS AND AN INDUCED MAGNETIC FIELD DETECTING METHOD

(75) Inventor: Shinsuke Komatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 128 days.

(21) Appl. No.: 11/562,649

(22) Filed: Nov. 22, 2006

(65) Prior Publication Data

US 2007/0222440 A1  Sep. 27, 2007

(30) Foreign Application Priority Data

Dec. 1, 2005 (JP) ............................. 2005-348533

(51) Int. Cl.
*G01R 33/035* (2006.01)
(52) U.S. Cl. .................. 324/248; 505/846
(58) Field of Classification Search .......... 324/239, 324/248–249, 256–258; 505/162, 845–846; 327/527–528; 600/409
See application file for complete search history.

(56) References Cited

FOREIGN PATENT DOCUMENTS

| JP | 2001-050934 | 2/2001 |
|----|-------------|--------|
| JP | 2002-313859 | 10/2002 |
| JP | 2003-287522 | 10/2003 |

*Primary Examiner*—Bot LeDynh
(74) *Attorney, Agent, or Firm*—RatnerPrestia

(57) ABSTRACT

The induced magnetic field detecting apparatus of the present invention is configured so as to irradiate laser light onto an inspection target from the same side as the side on which a pickup coil for magnetic field detection is disposed and be able to perform irradiation of the laser light and detection of a magnetic field induced by the irradiation of the laser light on the same side relative to the inspection target. Furthermore, the induction magnetic field detection apparatus of the present invention adopts a configuration in which laser light is irradiated onto the inspection target through the inside of the loop-shaped pickup coil set up inside the container. This configuration exerts an effect of being able to detect a feeble magnetic field with higher accuracy.

4 Claims, 12 Drawing Sheets

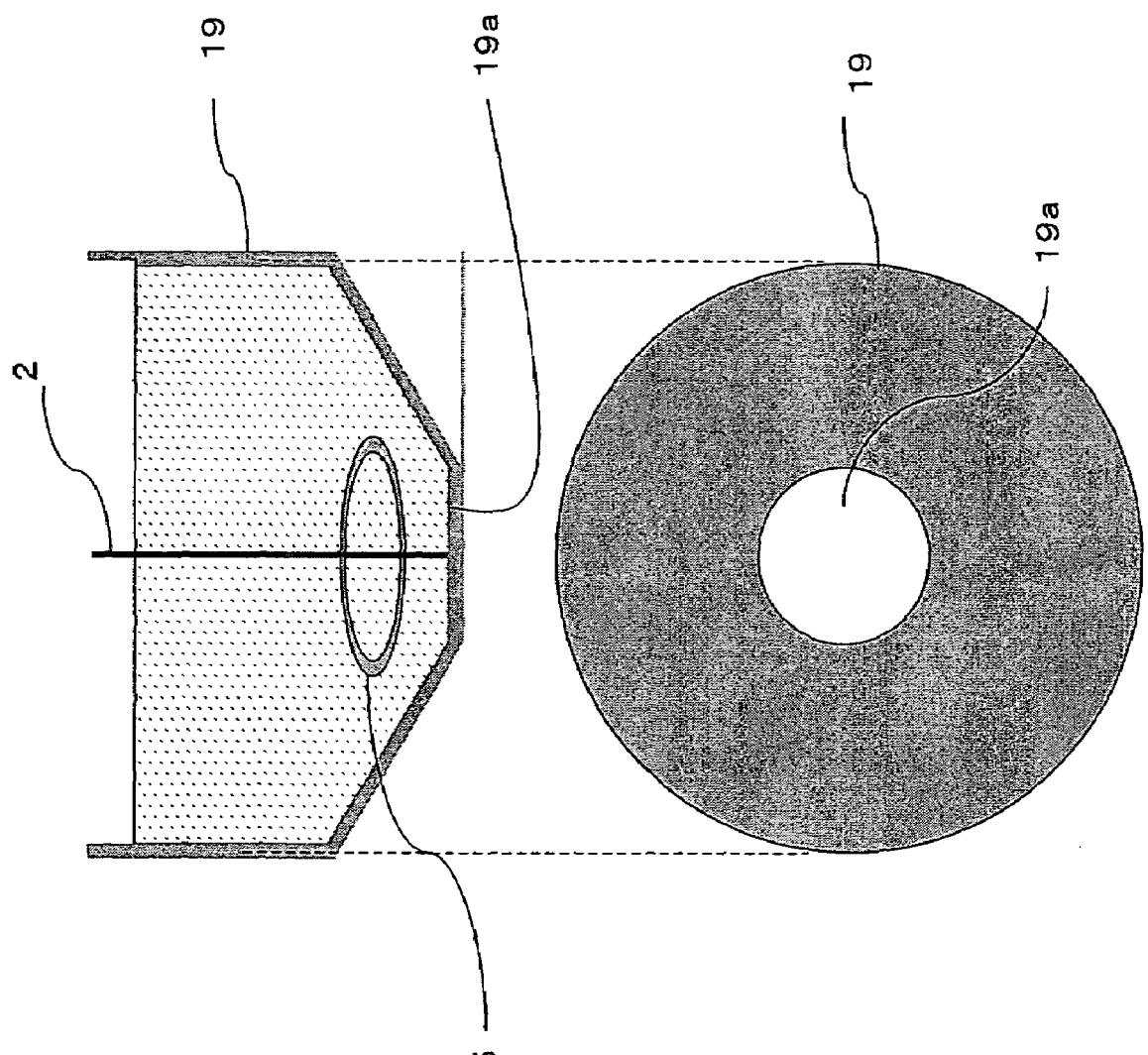

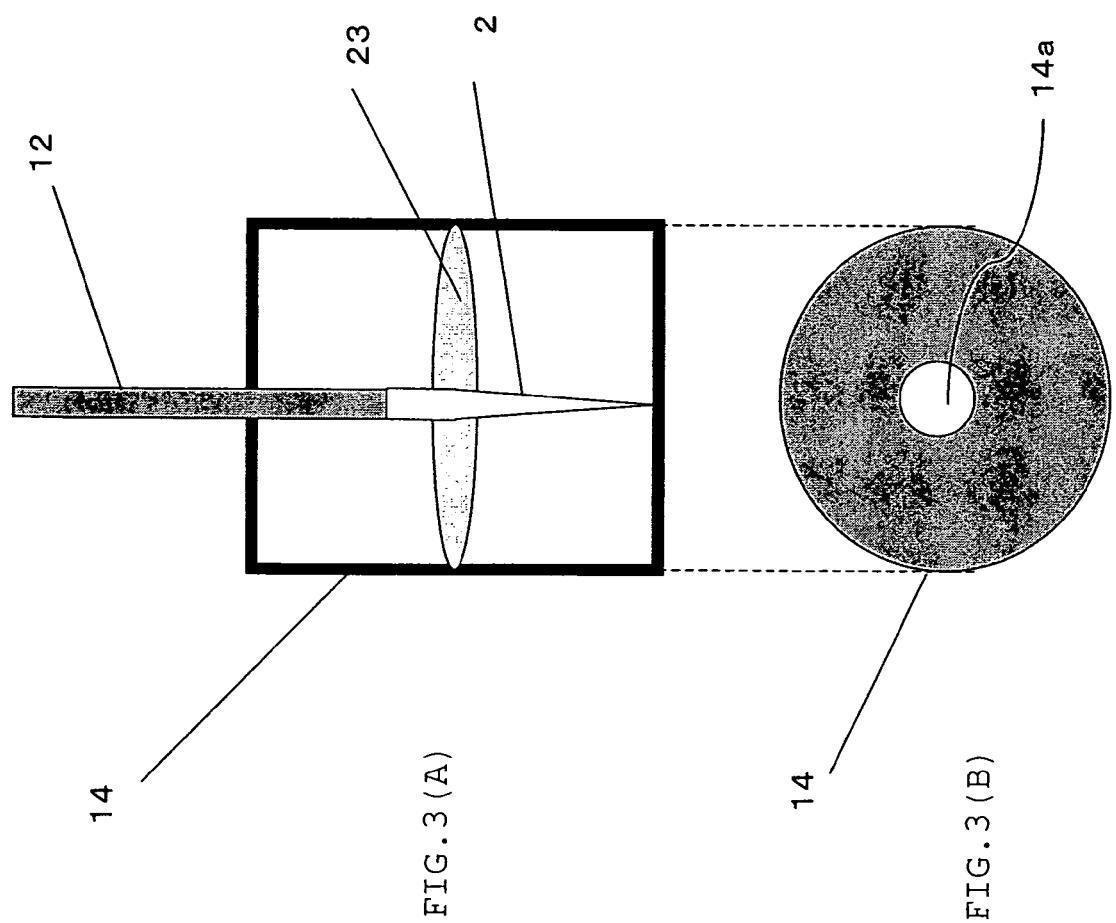

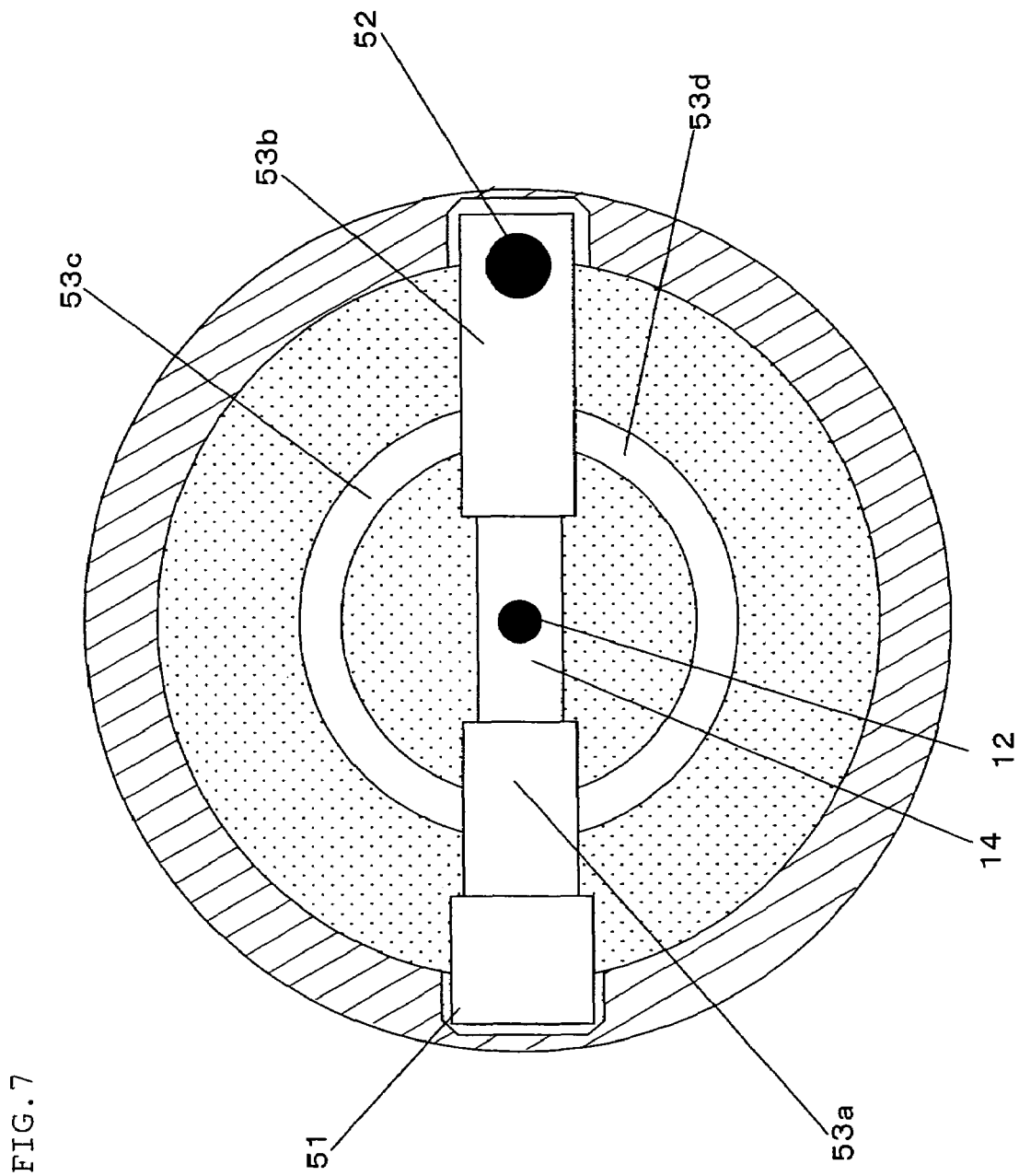

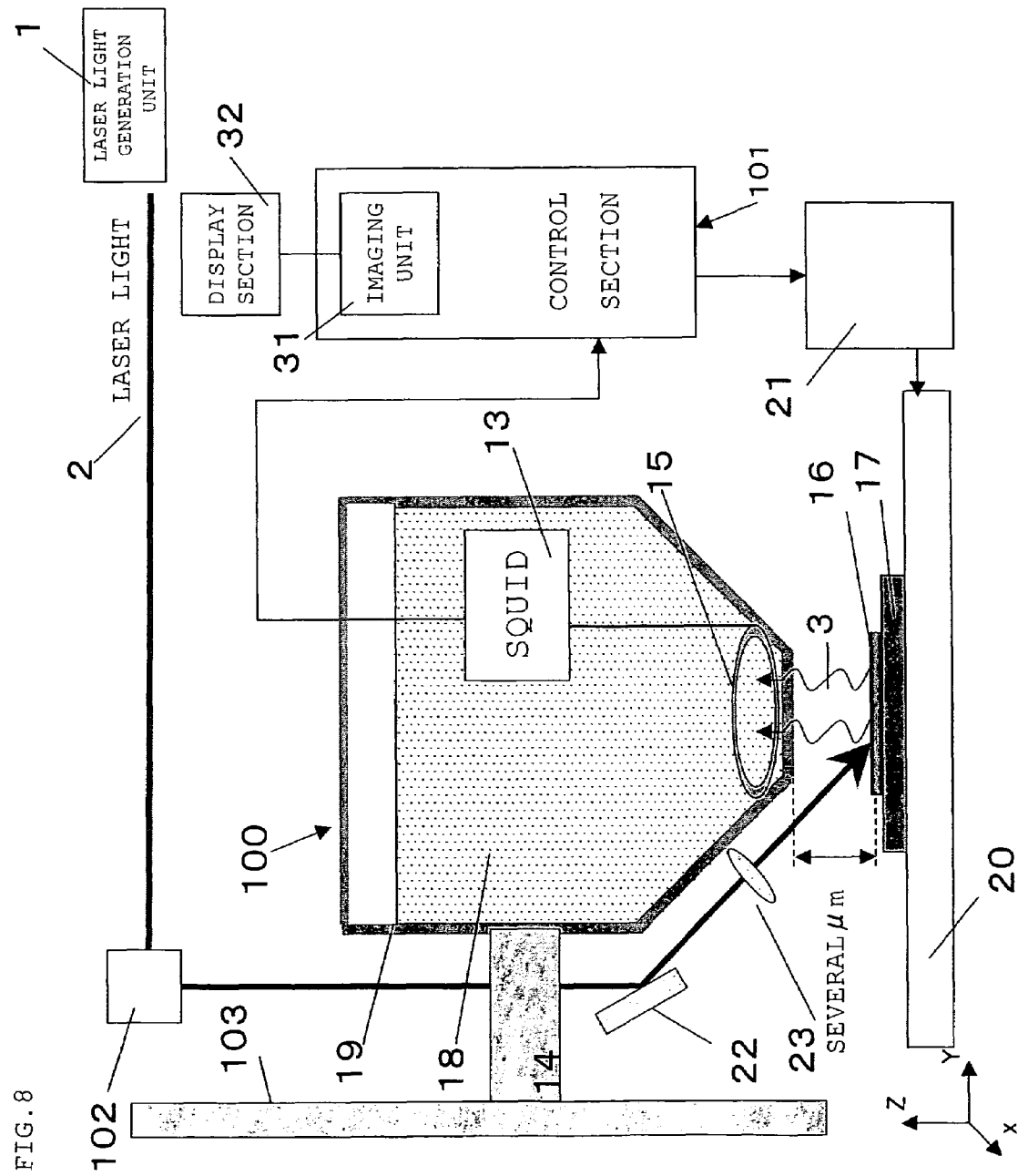

INDUCED MAGNETIC FIELD DETECTING APPARATUS AND AN INDUCED MAGNETIC FIELD DETECTING METHOD

This application claims foreign priority based on Japanese Patent application No. 2005-348533, filed Dec. 1, 2005, the content of which is incorporated herein by reference in its entirety.

BACKGROUND OF THE INVENTION

1. Field of the Invention

The present invention relates to an induced magnetic field detecting apparatus and an induced magnetic field detecting method.

2. Related Art of the Invention

FIG. 10 is a block diagram showing an outline of the basic configuration of a most common conventional scanning laser SQUID microscope.

As shown in the same figure, this scanning laser SQUID microscope 200 is equipped with a laser generator 201 which generates laser light 202. The laser light 202 is subjected to intensity modulation using a laser modulation signal generated in synchronization with a predetermined reference signal 210, condensed by an optical system 204 and then irradiated onto a sample (inspection target) 205. When the condensed laser light 203 is irradiated onto the sample 205, a photoinduced current is generated in the sample 205 and magnetism 206 is induced by that current. The intensity of this magnetism 206 is detected by a SQUID magnetic sensor 207.

In this case, the position of the point of irradiation on the sample 205 of the condensed laser light 203 is configured to be immediately below the SQUID magnetic sensor 207 which is disposed on the opposite side relative to the position of the sample 205. This is the necessary condition so that the SQUID magnetic sensor 207 can accurately detect the magnetic field generated through the irradiation of the laser light.

The magnetic field intensity detected by the SQUID magnetic sensor 207 is inputted to a lock-in amplifier 209 as a magnetic field signal 208. The lock-in amplifier 209 adjusts the phase difference between the magnetic field signal 208 and the reference signal 210, extracts a component having the same frequency as that of the reference signal 210 from the magnetic field signal 208 and outputs the component as an intensity signal 212. A series of such signal acquisitions are performed on the sample 205 by scanning a stage on the XY plane and it is thereby possible to acquire an image of a magnetic field distribution in the sample, which can be used to detect defects such as breakage of a wire of an inspection target.

As an application of such a scanning laser SQUID microscope, applications for an inspection and analysis of an LSI are under study. For example, Japanese Patent Laid-Open No. 2002-313859 discloses a technology of inspecting a semiconductor chip in a wafer state and a mounted state using a scanning laser SQUID microscope. Furthermore, as shown in FIG. 11, for example, the same document discloses a laser light source 151, an optical system 153 to condense laser light, a laser beam 162, a semiconductor chip 170 onto which the laser beam 162 is irradiated, a SQUID magnetic fluxmeter 112, a control apparatus 156 which controls the whole apparatus, a fixing member 160 which fixes a relative positional relationship between the optical system 153 and the SQUID magnetic fluxmeter 112 and a display device 158 or the like (see, for example, FIG. 14 of Japanese Patent Laid-Open No. 2002-313859). This is a configuration different from that in FIG. 10 in that the optical system 153 and the SQUID magnetic fluxmeter 112 are disposed on the same side as the semiconductor chip 170 which is the inspection target.

Furthermore, a scanning SQUID microscope shown in FIG. 12(A) and FIG. 12(B) is proposed as another conventional technology in a configuration with an optical system and a SQUID magnetic fluxmeter disposed on the same side (for example, see FIG. 11 of Japanese Patent Laid-Open No. 2001-50934).

FIG. 12(B) discloses a case where a laser light irradiation position P and a SQUID 252 are disposed on the same side with respect to an inspection target W on a stage 310, with such a configuration that a heat insulating case 253 is formed like a hollow cylinder, three sets of a pickup coil 251 and the SQUID 252 are incorporated in the heat insulating case 253 and laser light from a laser light generation source 221 is introduced into an objective lens 227 along the central axis of the heat insulating case 253.

When the configuration shown in FIG. 10 is applied to a case where a semiconductor chip mounted on a board is inspected, the presence of the board may obstruct laser irradiation onto the semiconductor chip which is the inspection target. In such a case, the magnetic field itself is not generated from the semiconductor chip, which makes inspection impossible, while the configuration as shown in FIG. 11, with the optical system 153 and the SQUID magnetic fluxmeter 112 disposed on the same side of the semiconductor chip 170 which is the inspection target, has no influence of the board and is considered as the configuration which makes it possible to inspect not only a semiconductor chip before mounting but also a semiconductor chip after mounting. The same applies to the configuration in FIG. 12, too.

On the other hand, instead of the configuration of condensing laser light on a sample with an objective lens, a SQUID microscope apparatus which observes the surface of a sample using evanescent light is proposed (see Japanese Patent Laid-Open No. 2003-287522). This SQUID microscope apparatus has a configuration in which an end of an optical fiber which has been subjected to predetermined processing is brought close to a distance on the order of the wavelength (several hundreds of nm) of light from a sample and the sample is excited by evanescent light generated from the end. Because evanescent light is an evanescent wave (evanishing wave) and can only exist in a range on the order of the wavelength of light, it is clearly distinguished from laser light.

Therefore, the SQUID microscope apparatus using such a nature specific to evanescent light allows observation up to the depth on the order of several nm from the surface of the sample with high accuracy, whereas it is not possible to nondestructively inspect, for example, an inner circuit of a semiconductor chip having several hundreds of μm in thickness mounted on the board.

SUMMARY OF THE INVENTION

However, when inspecting a semiconductor chip, a magnetic field generated is feeble (several pT). Therefore, in the conventional configuration shown in FIG. 11, the position on the semiconductor chip (inspection target) 170 at which the laser beam 162 is irradiated is next to the SUQUID magnetic fluxmeter 112, and therefore it is not possible to satisfy the condition that the SUQUID magnetic fluxmeter 112 needs to approach the inspection target sufficiently to the order of several μm, which is necessary to realize high spatial resolution at μm level, resulting in a problem that a feeble magnetic field cannot be detected with high accuracy.

Furthermore, in the conventional configuration shown in FIG. 12, the laser light irradiation position P on the inspection target W is diagonally across from the SUQUID microscope 252 and the pickup coil 251 and there is a distance equal to or greater than the radius of the objective lens 227, and therefore the above described necessary condition to be able to accurately detect the excited magnetic field cannot be met. For that reason, there is a problem that the feeble magnetic field cannot be detected with high accuracy as in the case of FIG. 11.

In view of the above described problems, it is an object of the present invention to provide an induced magnetic field detecting apparatus and an induced magnetic field detecting method capable of detecting a feeble magnetic field with higher accuracy.

The $1^{st}$ aspect of the present invention is an induced magnetic field detecting apparatus comprising:

a stage which holds an inspection target;

a laser light generation unit which generates laser light;

a laser light irradiation unit for irradiating said laser light onto said inspection target held on said stage;

a pickup coil for converting a magnetic field generated from said inspection target by said irradiated laser light to a current signal; and a SQUID magnetic field detection unit which outputs information on said magnetic field based on said current signal, wherein said laser light irradiation unit and said pickup coil are arranged on the same side as a position at which said inspection target is held relative to said stage and said pickup coil is disposed above the position of said inspection target onto which said laser light is irradiated.

The $2^{nd}$ aspect of the present invention is the induced magnetic field detecting apparatus according to the $1^{st}$ aspect of the present invention, wherein said laser light irradiated from said laser light irradiation unit passes inside said pickup coil.

The $3^{rd}$ aspect of the present invention is the induced magnetic field detecting apparatus according to the $2^{nd}$ aspect of the present invention, wherein said laser light irradiation unit comprises a condensing lens system which condenses said laser light and passes said laser light inside said pickup coil and a laser light guide unit for guiding the laser light from said laser light generation unit to said condensing lens system, and a whole or part of said laser light guide unit, said condensing lens system, said pickup coil and said SQUID magnetic field detection unit are accommodated in a container which contains liquid nitrogen.

The $4^{th}$ aspect of the present invention is the induced magnetic field detecting apparatus according to the $2^{nd}$ aspect of the present invention, wherein said laser light irradiation unit comprises a condensing lens system which condenses said laser light and passes said laser light inside said pickup coil and a laser light guide unit for guiding the laser light from said laser light generation unit to said condensing lens system, said pickup coil and said SQUID magnetic field detection unit are disposed in a container which contains liquid nitrogen, and said condensing lens system is disposed in a hollow space through which said laser light passes, said hollow space being provided in said container.

The $5^{th}$ aspect of the present invention is the induced magnetic field detecting apparatus according to the $1^{st}$ aspect of the present invention, wherein said laser light irradiated from said laser light irradiation unit passes outside said pickup coil.

The $6^{th}$ aspect of the present invention is the induced magnetic field detecting apparatus according to the $5^{th}$ aspect of the present invention, wherein said laser light irradiation unit comprises a condensing lens system which condenses said laser light and passes said laser light outside said pickup coil and a laser light guide unit for guiding said laser light from said laser light generation unit to said condensing lens system, and said pickup coil and said SQUID magnetic field detection unit are accommodated in a container which contains liquid nitrogen.

The $7^{th}$ aspect of the present invention is the induced magnetic field detecting apparatus according to the $1^{st}$ aspect of the present invention, wherein said information on said magnetic field is intensity of said magnetic field which penetrates said pickup coil.

The $8^{th}$ aspect of the present invention is an induced magnetic field detecting method comprising:

holding an inspection target on a stage;

irradiating laser light using a laser light irradiation unit onto said inspection target held on said stage;

converting a magnetic field generated by said irradiated laser light from said inspection target to a current signal using a pickup coil; and outputting information on said magnetic field based on said current signal by a SQUID magnetic field detection, wherein said laser light irradiation unit and said pickup coil are arranged on the same side as a position at which said inspection target is held relative to said stage and said pickup coil is disposed above the position of said inspection target onto which laser light is irradiated.

The present invention exerts an effect that it is possible to detect a feeble magnetic field with higher accuracy.

BRIEF DESCRIPTION OF THE DRAWINGS

FIG. 2(A) is a partial longitudinal cross-sectional view of a liquid nitrogen container according to Embodiment 1 of the present invention;

FIG. 2(B) is a bottom view of the liquid nitrogen container of this Embodiment 1;

FIG. 3(A) is a longitudinal cross-sectional view of the optical apparatus with a condensing lens of Embodiment 1 of the present invention and FIG. 3(B) is a bottom view of the optical apparatus with a condensing lens of this Embodiment 1;

FIG. 7 is a conceptual diagram showing a Q-Q' section of the modification example of the scanning laser SQUID microscope of Embodiment 1 of the present invention;

FIG. 8 is a conceptual diagram illustrating a scanning laser SQUID microscope according to Embodiment 2 of the present invention;

DESCRIPTION OF SYMBOLS

Figure 1:
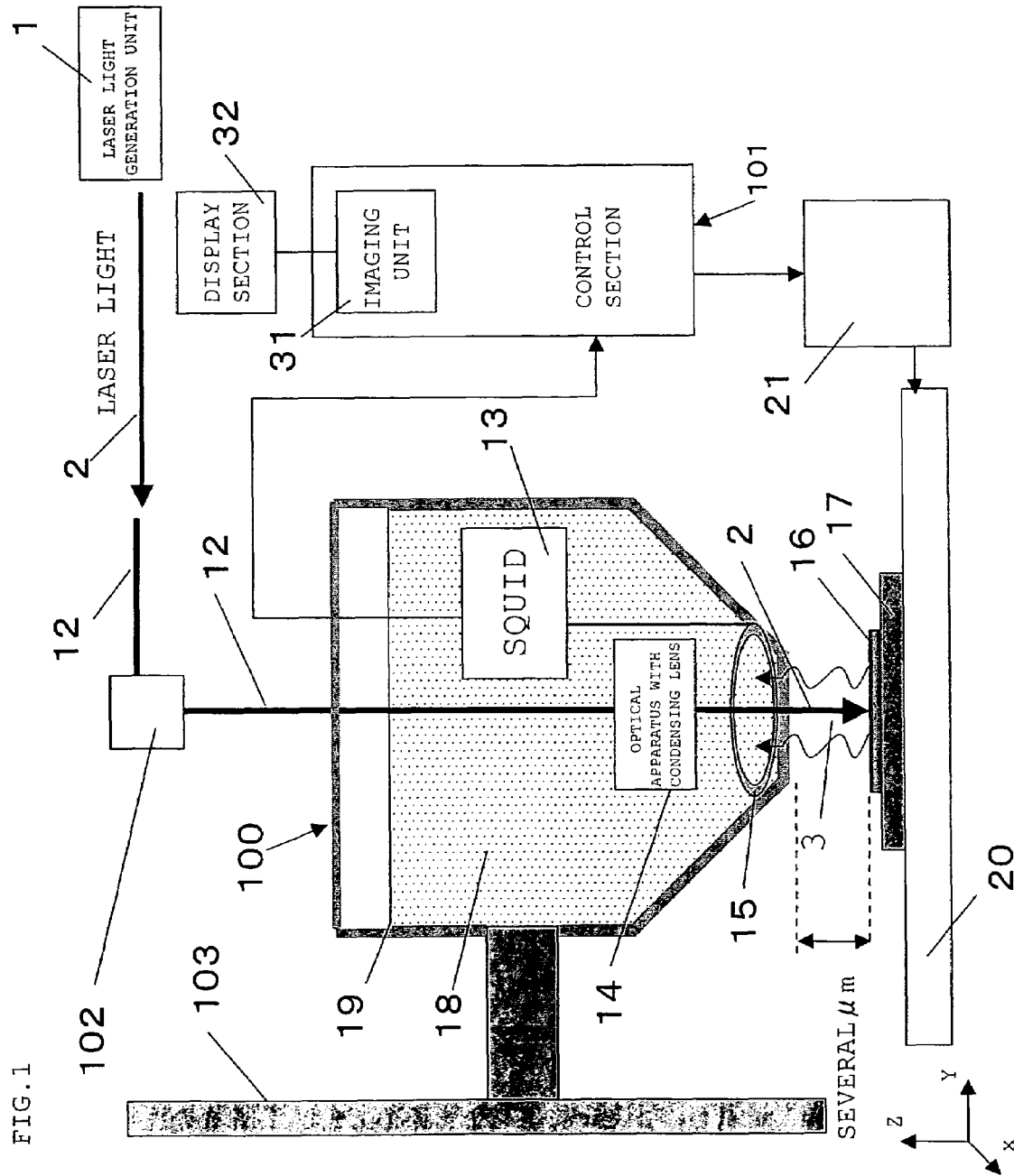
FIG. 1 is a conceptual diagram illustrating a scanning laser SQUID microscope according to Embodiment 1 of the present invention.

1 Laser light generation unit
2 Laser light
3 Magnetic field generated
13 SQUID
14 Optical apparatus with condensing lens
15 Pickup coil
16 Inspection target
17 Mounting board
18 Liquid nitrogen
19 Container
20 XY stage
21 XY stage control apparatus
23 Condensing lens
31 Imaging unit
32 Display section
101 Control section
102 Laser path control section
103 Support apparatus

PREFERRED EMBODIMENT OF THE INVENTION

Hereinafter, an embodiment of an induced magnetic field detecting apparatus of the present invention will be explained more specifically with reference to drawings.

Embodiment 1

FIG. 1 is a conceptual diagram showing the configuration of a scanning laser SQUID microscope of Embodiment 1 of the present invention and the configuration of this embodiment will be explained with reference to the same figure.

As shown in FIG. 1, this scanning laser SQUID microscope is provided with a laser light generation unit 1 which irradiates laser light 2, a laser light guide unit 12, a SQUID (Superconducting Quantum Interference Device) 13, an optical apparatus with a condensing lens 14, a pickup coil 15, a container 19 which contains liquid nitrogen 18, an XY stage 20 and a laser path control section 102. A control section 101 which controls the operation of the XY stage control apparatus and the operation of an imaging unit 31 which obtains an output signal from the SQUID 13 and forms an image signal to display a measurement result on a display section 32 is also provided.

The concept including the laser light guide member 12 and the optical apparatus with a condensing lens 14 of this embodiment is an example of the laser light irradiation unit of the present invention.

The laser light generation unit 1 is an apparatus which outputs laser light 2 which is directly noninductive to a magnetic field which is an observed physical quantity through temporal intensity modulation. This laser light 2 is configured so as to be sent to an inspection target 16 through the laser light guide member 12 and the optical apparatus with a condensing lens 14.

The laser light guide member 12 is intended to suppress attenuation of laser light inside liquid nitrogen and efficiently supply laser light from the laser light generation unit 1 to a desired point and, for example, an optical fiber can be suitably used therefor.

In this embodiment, a laser path control section 102 is provided in the path of the laser light 2. This laser path control section 102 is intended to fine-tune relative positions of the laser light guide member 12, optical apparatus with a condensing lens 14 and pickup coil 15.

The initial position of the optical axis of the laser light 2 is aligned with the central axis of the pickup coil 15 and configured so as to be able to quickly translate the optical axis of the laser light 2 in parallel from the central axis to optimize measurement sensitivity of the magnetic field.

Generally, a magnetic field is not always generated from the same location at which laser light is irradiated. Therefore, considering a case where the magnetic field cannot be sufficiently detected by the pickup coil 15 when a magnetic field is generated at a location a little distant from the irradiation position, the position of the optical axis of the laser light 2 is fine-tuned in real time so as to always keep the sensitivity in an optimum condition as the XY stage 20 is scanned. The above described fine-tuning range is strictly limited to within a range extremely close to predetermined scanning sample points and does not reach neighboring sample points.

In order to realize the above described fine-tuning, the laser path control section 102, laser light guide member 12 and optical apparatus with a condensing lens 14 may be united and the laser path control section 102 may be fine-moved in an X-Y direction using a motor (not shown). This allows the position of the optical axis of the laser light guide member 12 to be fine-tuned.

The laser light 2 travels in the laser light guide member 12 provided along the central axis of the container 19 containing liquid nitrogen 18 via the laser path control section 102. The laser light 2 is then guided to the inside of the optical apparatus with a condensing lens 14 provided inside the container 19 by the laser light guide member 12. The laser light emitted from the laser light guide member 12 inside the optical apparatus with a condensing lens 14 is condensed by a condensing lens 23 (see FIG. 3) and then irradiated onto the inspection target 16 through the central part of the loop-shaped pickup coil 15.

The pickup coil 15 is intended to detect a magnetic field 3 generated and a feeble current signal generated at the pickup coil 15 by the magnetic field is inputted to the main unit of the SQUID 13.

Liquid nitrogen 18 is intended to cool the pickup coil 15 and the SQUID 13 or the like to improve electric conductivity. The container 19 is made of, for example, stainless steel and is supported by a support apparatus 103 which also serves as a Z-axis control apparatus in a vertically adjustable manner as shown in FIG. 1. For example, when a manufacturing lot of mounted semiconductor chips as the inspection target 16 is changed and when the height of the semiconductor chip is changed, the support apparatus 103 moves in the Z-axis direction to adjust the distance between the bottom surface of the container 19 and the inspection target 16. Alternately, though details will be described later, when resolution needs to be changed according to the inspection contents of the inspection target 16, the support apparatus 103 also moves the container 19 in the Z-axis direction. The Z-axis control apparatus operates according to a control signal from the control section 101.

The bottom of the container 19 which is cylindrical is narrowed into a funnel-shape as shown in FIG. 2 and a glass window 19a which lets laser light pass is provided in the center of the bottom surface. The outside diameter and the height of the container 19 are approximately 10 cm or less and the size of the glass window 19a is several tens to several hundreds of μm in diameter, which is substantially the same as the diameter of the pickup coil 15.

Furthermore, the optical apparatus with a condensing lens 14 has a hollow cylindrical outside shape having a diameter of approximately 5 cm as shown in FIG. 3, has a water-proof structure and is provided with a condensing lens 23 inside. The condensing lens 23 is intended to adjust the focus on the inspection target 16, an optical fiber which is the laser light guide member 12 is inserted therein up to a point right above the condensing lens 23 and laser light from an end thereof is irradiated onto the condensing lens. A laser light output glass window 14a is provided in the center of the bottom surface of the optical apparatus with a condensing lens 14 and the laser light condensed through the glass windows 14a is irradiated onto the inspection target 16. The diameter of the glass windows 14a is, for example, several tens to several hundreds of μm.

The XY stage 20 on which the inspection target 16 is placed is made to move in the XY direction by the XY stage control apparatus 21. The direction of the movement and the amount of movement thereof are controlled by the control section 101. On the other hand, as described above, the control section 101 receives a detection signal from the SQUID 13 provided in the container 19 as input. This signal is converted to an image signal by the imaging unit 31 and is displayed as an image on the display section 32.

Next, the principle and the operation of the scanning laser SQUID microscope of this embodiment will be explained and at the same time an embodiment of the induced magnetic field detecting method of the present invention will also be described.

The scanning laser SQUID microscope configured as described above mounts and fixes the inspection target (mounted semiconductor chip or the like) 16 on the XY stage 20, condenses and irradiates laser light 2 onto this inspection target 16. When the inspection target 16 is irradiated with laser light 2, energy conversion takes place in an area where the laser light 2 enters. In many inspection targets, the laser light 2 is converted to heat energy and the temperature at the focus rises. When the inspection target is semiconductor such as the IC, electric charge is generated through a photoelectric conversion and a diffusion current is generated according to a concentration gradient. A drift current is generated in a depletion layer where there is an inner electric field and then the laser light 2 may be directly converted to a current.

When energy of light is converted to that of heat or current in this way, magnetic spin is thereby changed or a current is generated causing a subtle variation in magnetic flux generated from the inspection target or magnetic flux which passes through the inspection target. This change is picked up by the pickup coil 15 and measured by the SQUID 13 and a magnetic signal which reflects the physical characteristic of the surface of the inspection target 16 or an electric characteristic inside is obtained. By sequentially scanning laser irradiation positions, it is possible to inspect the entire inspection target 16 and convert the magnetic signal obtained to an image.

In this way, the scanning laser SQUID microscope of this embodiment is an example of the induced magnetic field detecting apparatus which irradiates condensed laser light onto the surface of the inspection target, measures a change of the magnetic field thereby induced using the SQUID, and can thereby measure a magnetic field distribution which reflects the physical characteristic or the like of the inspection target in a noncontact fashion and applies processing of imaging or the like.

Next, the operation of the apparatus of this embodiment will be explained more specifically.

When an inspection is actually performed, a semiconductor device which is the inspection target 16 is fixed onto the XY stage 20 and laser light 2 is outputted from the laser light generation unit 1. A wavelength switching function is added to the laser light generation unit 1 so that wavelengths of laser light 2 outputted can be switched. The wavelength used may differ depending on the light absorption band of the irradiation target and even the same target may have different measuring results depending on the wavelength, and therefore it is possible to measure a wide range of samples by adding the wavelength switching function to the laser light generation unit 1 and obtain various observation results.

The wavelength range of laser light 2 is generally on the order of 300 nm to 1200 nm.

First, the laser light 2 outputted from the laser light generation unit 1 travels through the laser light guide member 12, passes through the laser path control section 102 and the optical apparatus with a condensing lens 14 on the way, and is thereby irradiated in a condition condensed at an optimum irradiation position. This irradiation causes excitation energy to be supplied to the inspection target 16 and a feeble magnetic field (several pT) is generated through energy conversion. The feeble magnetic field generated is reliably detected by the pickup coil 15 provided at a close distance of several μm right above the laser irradiation position of the inspection target 16 and measured by the SQUID 13.

A measurement signal from the SQUID 13 is supplied to the control section 101 and converted to an image signal by a known imaging unit 31, and then supplied to the display section 32 of a liquid crystal display or the like. On the display section 32, it is possible not only to inspect physical characteristics such as delamination of the inspection target but also inspect the electric characteristic such as wire breakage with higher accuracy using methods such as comparing a measured image with a reference image.

The scanning laser SQUID microscope shown in FIG. 1 is designed such that the laser light 2 passes inside the pickup coil 15. Therefore, the laser light 2 for generating a magnetic field and the pickup coil 15 for detecting a magnetic field are arranged on the same side (upside in FIG. 1) with respect to the inspection target 16. This makes it possible to induce a magnetic field by laser light and detect the magnetic field generated on the same side with respect to the inspection target.

According to this embodiment in this way, even when the semiconductor chip which is the inspection target 16 is mounted on the board and it is difficult for laser light or magnetic field generated to penetrate from one side, it is possible to efficiently generate and detect a magnetic field. Moreover, the feeble magnetic field generated is reliably detected by the pickup coil 15 brought close to a distance of several μm right above the laser irradiation position of the inspection target 16 thereby allowing detection with high accuracy.

That is, because the laser light 2 and the pickup coil 15 are on substantially the same axis, the magnetic field generated can be detected with high sensitivity. The instantaneous current generated at the inspection target 16 produces a magnetic field according to Ampere's law, and the greater the distance from the point at which the magnetic field is generated, the feebler this magnetic field becomes. That is, the shorter the distance between the point at which the magnetic field is generated and the detection point, the higher is the sensitivity with which the magnetic field can be detected, and therefore it is preferable to bring the pickup coil 15 and the laser light irradiation point on the inspection target 16 as close as possible to each other. The present invention realizes this by arranging the optical axis of the laser light 2 and the pickup coil 15 on substantially the same axis.

The optical apparatus with a condensing lens 14 shown in FIG. 3 may also be made to be replaceable. This allows replacement with an optical apparatus with a condensing lens 14 of a different focal length and it is possible to realize an accurate nondestructive inspection even when, for example, the height of the internal circuit of the semiconductor IC as the inspection target 16 from the XY stage 20 is different.

Next, a modification example of the container 19 shown in FIG. 1 will be explained using FIG. 4(A) and FIG. 4(B).

Figure 4A:
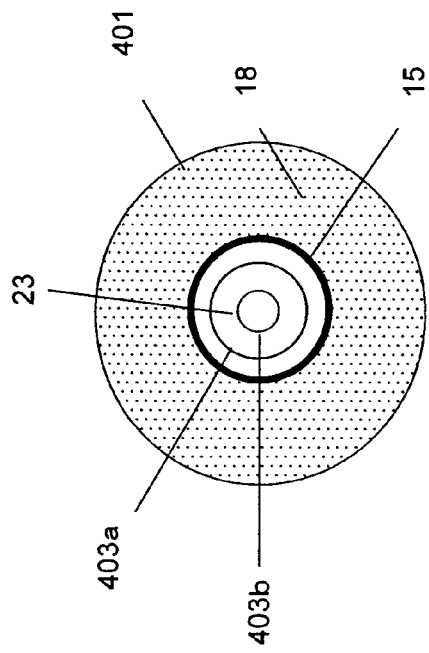
FIG. 4(A) shows a schematic cross-sectional view of a liquid nitrogen container or the like as a modification example of Embodiment 1 and FIG. 4(B) is a schematic longitudinal cross-sectional view of the liquid nitrogen container or the like as a modification example of Embodiment 1.
Figure 4B:
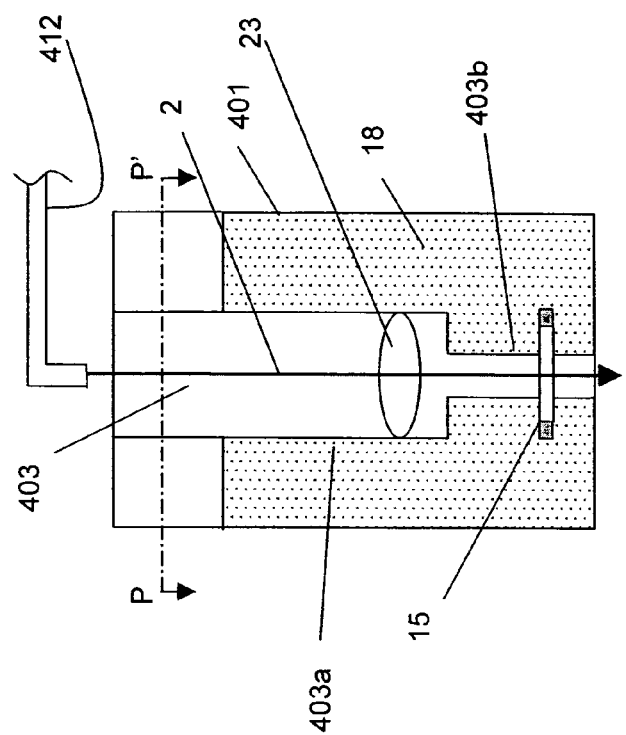

FIG. 4(B) is a schematic diagram illustrating a container 401 which is a modification example of the container 19. FIG. 4(A) is a schematic diagram showing a P-P' section of FIG. 4(B).

According to FIG. 4(A) and FIG. 4(B), the container 401 and a laser light guide member 412 have a configuration different from that shown in FIG. 1. This laser light guide member 412 is additionally provided up to a point just before the opening of a hollow space 403 of the container 401 containing liquid nitrogen 18. The container 401 is provided with the cylindrical hollow space 403 whose diameter differs between an upper part 403a and a lower part 403b. Laser light 2 emitted from the laser light guide member 412 passes along the central axis of this hollow space 403 and passes through a condensing lens 23 provided in the part having a large diameter of the hollow space 403.

As for the hollow space 403, the upper part 403a thereof has a large inner diameter, while the lower part 403b has a small inner diameter, and the lower part 403b passes inside a loop-shaped pickup coil 15.

The pickup coil 15 is disposed inside the container 401 and the laser light 2 passes through the center thereof. Such a configuration allows the pickup coil 15 to contact liquid nitrogen 18 and since the laser light 2 passes inside the hollow space 403, it is not affected by liquid nitrogen 18. Since the container 401 contains the hollow space 403, there is no need for the glass window 19a as shown in FIG. 2(B).

Next, another modification example of the container 401 shown in FIG. 4(A) and FIG. 4(B) will be explained using FIG. 5.

Figure 5:
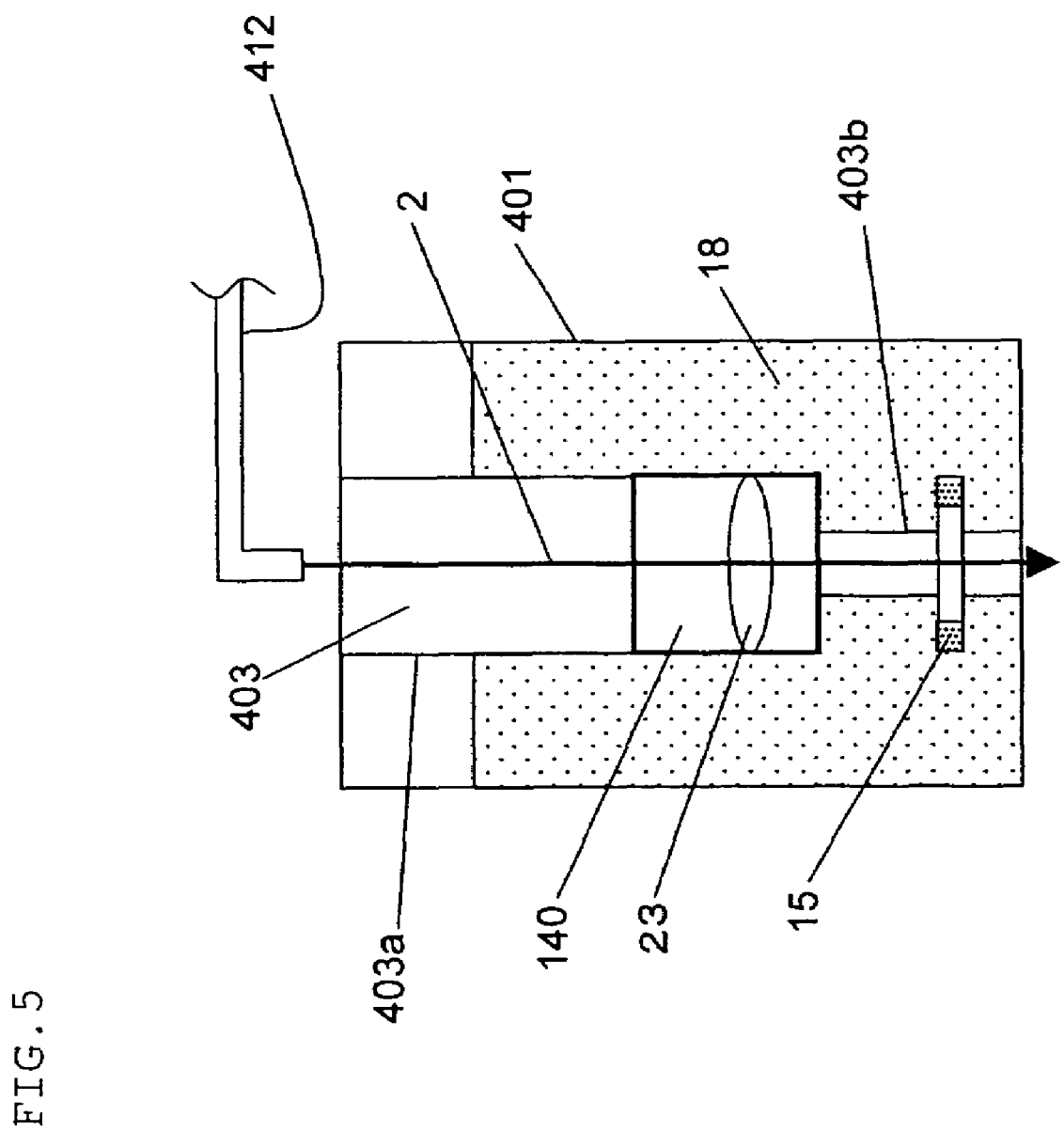
FIG. 5 is a schematic longitudinal cross-sectional view of a modification example of the liquid nitrogen container shown in FIG. 4(A) and FIG. 4(B)

FIG. 5 is a schematic diagram illustrating a modification example of the container 401.

That is, an optical apparatus with a condensing lens 140 shown in FIG. 5 is a replaceable cylindrical case containing a condensing lens 23. An opening window for letting laser light pass is provided in the center of each of the top surface and the bottom surface of this optical apparatus with a condensing lens 140. Furthermore, the bottom surface and the peripheral surface of this optical apparatus with a condensing lens 140 and the surface of an upper section 403a are worked to high accuracy and configured such that it can be fitted with accuracy on the order of several µm. Components basically identical to those in FIG. 4 are assigned the same reference numerals and explanations thereof will be omitted.

Furthermore, a modification example of the SQUID magnetic field detection unit 100 shown in FIG. 1 will be explained.

Figure 6:
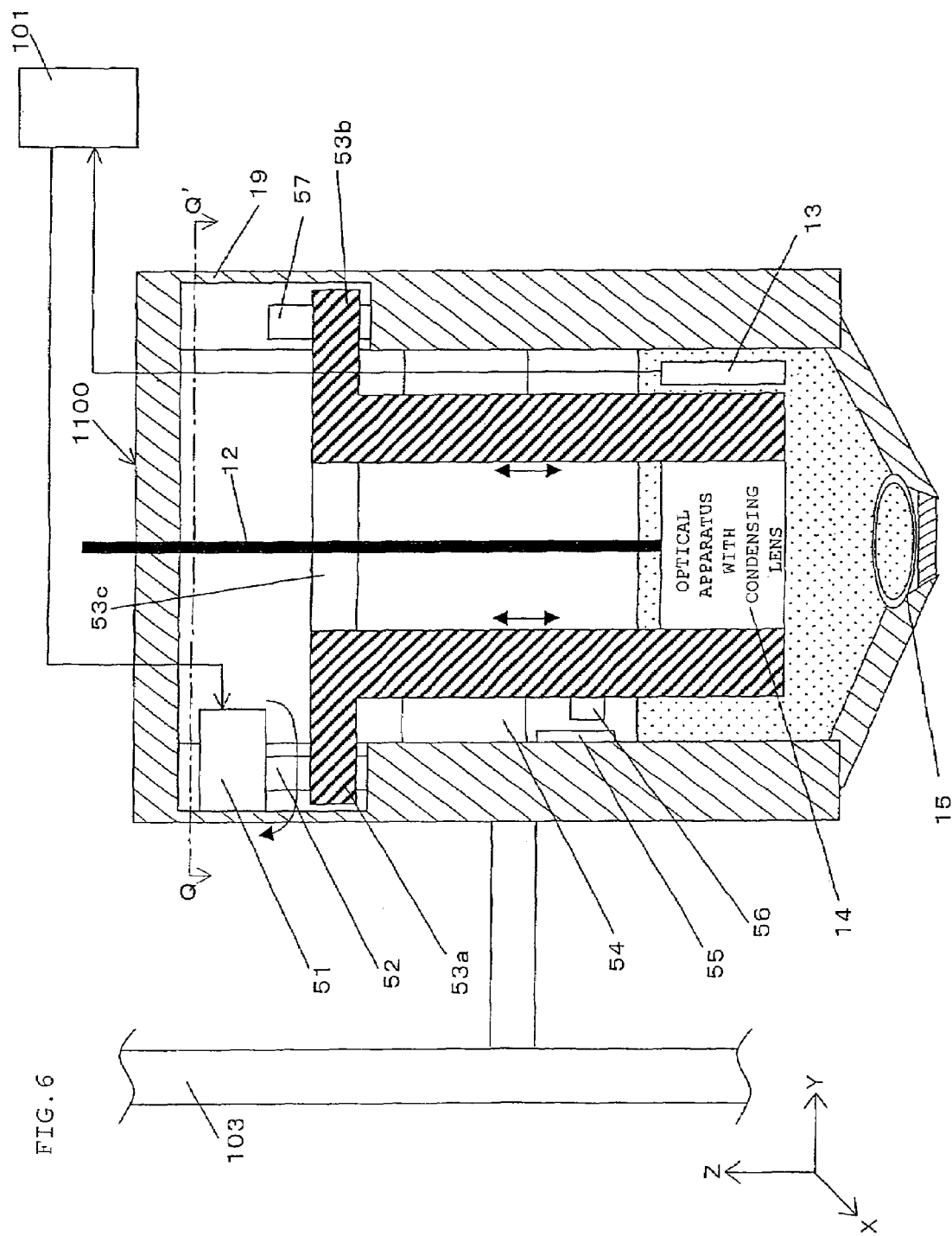
FIG. 6 is a conceptual diagram illustrating a modification example of the scanning laser SQUID microscope of Embodiment 1 of the present invention.

FIG. 6 is a conceptual diagram illustrating the configuration and the operation of a modification example of the scanning laser SQUID microscope shown in FIG. 1. Furthermore, FIG. 7 is a conceptual diagram showing a Q-Q' section of FIG. 6.

That is, a SQUID magnetic field detection unit 1100 shown in FIG. 6 is different from the SQUID magnetic field detection unit 100 shows in FIG. 1 in that an optical apparatus with a condensing lens 14 is movable in the Z-direction.

First, the reason that the optical apparatus with a condensing lens 14 is made to be movable in the Z-direction will be described.

That is, necessary resolution differs according to the inspection contents of the inspection target 16. Therefore, the support apparatus 103 changes a distance between the pickup coil 15 and the inspection target 16 to realize predetermined resolution.

On the other hand, since the focal length of the condensing lens 23 incorporated in the optical apparatus with a condensing lens 14 does not change, it is necessary to move the optical apparatus with a condensing lens 14 relative to the container 19 according to the amount of movement of the container 19 by the support apparatus 103.

Here, explanations will be focused on differences and the same components are assigned the same reference numerals and explanations thereof will be omitted.

As shown in FIG. 6 and FIG. 7, the SQUID magnetic field detection unit 1100 is provided with a motor 51 and a ball screw 52 provided as the rotation axis of the motor 51 in the upper part of the side wall. A substantially L-figured drive section 53a which can move in the vertical direction as the ball screw 52 rotates is configured such that a screw hole provided in the short side thereof engages with the ball screw 52. Furthermore, a drive section 53b having the same shape as the substantially L-figured drive section 53a is disposed on the opposite side in the container 19. A pair of these drive sections 53a and 53b hold the optical apparatus with a condensing lens 14 at a predetermined position at an end of the long side thereof. A hole is provided in the short side of the drive section 53b, which engages with a pin 57 accurately and the short side of the drive section 53b is smoothly movable in the vertical direction. The drive sections 53a and 53b are fixed so as to be mutually united on the short side by semi-circular fixing members 53c and 53d. A linear scale 55 is provided in the center of the inner wall of the container 19 and a sensing section 56 is provided on the long side of the driving section 53a facing the linear scale 55. The sensing section 56 outputs a position detection result to the control section 101. Furthermore, the motor 51 rotates according to a control signal from the control section 101.

By way of example, this embodiment assumes that the circumference of the ball screw 52 is 10 mm and one revolution of the motor is controlled with 10000 pulses. Since the required resolution in the Z-direction changes according to the inspection target, these values can also change. Therefore, the positioning accuracy of the motor 51 also differs.

In this case, it is possible to move the drive sections 53a and 53b with resolution of $10 \times 10^{-3}/10^4 = 1$ µm.

Under the above described configuration, the motor 51 and the optical apparatus with a condensing lens 14 or the like perform the following operation.

A case where the support apparatus 103 moves the container 19 by an amount of movement A in the positive direction on the Z axis under the instruction from the control section 101 will be described. In this case, the control section 101 gives the motor 51 an instruction on the amount of rotation for moving the optical apparatus with a condensing lens 14 by the amount of movement A in the negative direction of the Z axis. When the motor 51 rotates based on this instruction, the drive sections 53a and 53b move downward and the sensing section 56 also moves. The sensing section 56 reads scale information indicated on the linear scale 55 and outputs it to the control section 101. The control section 101 obtains the amount of actual movement B of the optical apparatus with a condensing lens 14 from the scale information sent. The control section 101 causes the motor 51 to rotate in such a way that the difference between the amount of actual movement B and the above described amount of movement A becomes zero or falls within a predetermined range. This allows the focal length of the condensing lens 23 to be adjusted accurately.

As another method of focusing of the condensing lens 23, the following operation may be performed in a configuration without the linear scale 55 or sensing 56.

That is, the control section 101 gives the motor 51 an instruction on the amount of rotation for moving the optical apparatus with a condensing lens 14 by the amount of movement A in the negative direction of the Z axis. By rotating the motor 51 based on this instruction, the drive sections 53a and 53b move downward. At the same time, laser light 2 is irradiated onto the inspection target 16 under the instruction from the control section 101 and the intensity of the magnetic field is measured by the SQUID 13. As a result, the rotation of the motor 51 is controlled so that the intensity of the magnetic field becomes a maximum and the position of the optical apparatus with a condensing lens 14 is fine-tuned. This allows the focal length of the condensing lens 23 to be adjusted accurately.

Furthermore, it is also possible to combine both the adjustment using the sensing section 56 and the measurement of the intensity of the magnetic field as appropriate. This further improves the accuracy of adjustment of the focal length of the condensing lens 23.

This exerts the effect that the distance between the condensing lens 23 and the inspection target can always be maintained so as to achieve focus even when the position of the container 19 in the Z-direction is changed.

Embodiment 2

Next, another embodiment according to an induced magnetic field detecting apparatus of the present invention will be explained using FIG. 8.

As shown in FIG. 8, in this embodiment, unlike Embodiment 1 described in FIG. 1, laser light 2 does not pass inside the container 19, but passes outside and is irradiated onto the inspection target 16. Because other points are the same as those in the first embodiment, the same parts are assigned the same reference numerals.

As shown in FIG. 8, as for the configuration of the laser SQUID microscope shown in this embodiment, the laser light irradiated from a laser light generation unit 1 is bent downward at a laser path control section 102. The laser light travels through a bypass along the peripheral surface of a container 19 and the path is then changed diagonally downward by a laser light path control mirror 22 and the laser light is condensed with a condensing lens 23 and is irradiated onto an inspection target 16. The laser SQUID microscope shown in this embodiment differs from the case in FIG. 1 in that it is configured as shown above. Such a configuration is also effective when a relatively large space (several hundreds of μm or above) can be provided between the inspection target and the bottom surface of the container 19.

Since the laser light 2 does not pass through the container 19, the glass window 19a as shown in Embodiment 1 need not be provided for the container 19.

As in the case of Embodiment 1, the laser SQUID microscope of this embodiment has the configuration in which irradiation of laser light 2 for generating a magnetic field and detection of a magnetic field by a pickup coil 15 are performed on the same side of an inspection target 16.

Next, while explaining the operation of the scanning laser SQUID microscope of this embodiment, an embodiment of the induced magnetic field detecting method of the present invention will be described at the same time.

That is, in the above described configuration, the laser path control section 102 changes the path of the laser light 2 irradiated from the laser light generation unit 1 downward. The path of the laser light is further changed diagonally downward by the laser light path adjustment mirror 22 and then the laser light is condensed by the condensing lens 23 and irradiated onto the inspection target 16 from diagonally above. A feeble magnetic field generated through this irradiation is detected by the pickup coil 15 in the container 19 disposed substantially right above the laser irradiation point of the inspection target 16 and measured by a SQUID 13. Then, the measurement result is converted to an image signal by an imaging unit 31 and displayed on a display section 32.

Therefore, the apparatus of this embodiment shown in FIG. 8 also allows a high accuracy inspection of a semiconductor chip mounted on a board as in the case of the apparatus according to Embodiment 1 shown in FIG. 1.

In the above described embodiments, the imaging unit 31 is provided and the result of measurement by the SQUID 13 is displayed as an image, but the present invention is not limited to this and, for example, it is also possible to provide a separate data storage unit instead of the apparatus provided with such an imaging unit 31, cause the data storage unit to store the result of measurement by the SQUID 13 and process the data using an appropriate data processing unit later.

Furthermore, displaying the measurement result as an image facilitates judgment of the inspection result, but the measurement result need not always be imaged and may also be displayed directly as numerical values depending on the situation.

Furthermore, above Embodiment 1 has explained the case where the condensing lens 23 is disposed above the pickup coil 15 and the laser light guide member 12 is additionally provided just before the condensing lens 23, but such a case is not exclusive and when, for example, the fiber has such a small diameter that poses no problem with respect to the pickup coil 15 and the pickup coil 15 can detect the magnetic field 3 generated sufficiently, it is also possible to adopt a configuration whereby the fiber itself is made to pass inside the pickup coil 15. In this case, the condensing lens may not be disposed or if disposed, it may be disposed under the pickup coil 15.

Furthermore, the above embodiments have explained the case where a semiconductor IC before mounting or after mounting is used as the inspection target, but such a case is not exclusive and examples of other targets include a solar cell and a thin-film TFT for a display or the like.

Furthermore, the above embodiments have explained the case where the central axis of the pickup coil 15 and the optical axis of the laser light 2 are substantially the same or parallel, but this case is not exclusive and, for example, the optical axis of the laser light guide member 12 in the container 19 or the optical apparatus with a condensing lens 14 may be placed diagonally with respect to the central axis of the pickup coil 15 and the laser light 2 irradiated may travel diagonally in the container 19. In short, how the path of the laser light is configured does not matter if at least the laser light passes inside the pickup coil 15 and the pickup coil 15 is placed above the irradiation position of the inspection target.

Furthermore, the above embodiments have explained the configuration whereby an XY stage is provided so as to automatically scan the inspection target in the XY direction, but such a case is not exclusive and it is also possible to adopt a configuration capable of scanning only in any one of the X and Y directions or a configuration capable of scanning in none of the X and Y directions.

Furthermore, the above embodiments have explained the configuration whereby the container 19, laser light guide member 12, laser path control section 102 or condensing lens 23 can be moved in the Z-direction, too, but this configuration is not exclusive and, for example, a configuration in which the container cannot move in the Z-direction is also acceptable.

The scanning laser SQUID microscope described in the above embodiments irradiates the inspection target with laser light which has been irradiated from the laser light irradiation unit and guided by the laser light guide member from the same side as the pickup coil which detects a magnetic field, performs irradiation of laser light and detection of a magnetic field on the same side onto the inspection target, and can thereby efficiently generate and detect a magnetic field of a semiconductor device mounted on a board through which it is difficult for the laser light and magnetic field to pass regardless of the existence of the board. Moreover, because the pickup coil is disposed above the position of the inspection target onto which laser light is irradiated, it is possible to detect a feeble magnetic field even at an inspection of a mounted semiconductor chip with higher accuracy.

Moreover, since the scanning laser SQUID microscope irradiates laser light onto the inspection target through the inside of the ring-shaped pickup coil, it has a compact structure and can detect a magnetic field with high accuracy.

Furthermore, the above embodiment has setup the laser path control apparatus which controls the path of laser light on the same axis as the central axis of the pickup coil and irradiates the laser light onto the inspection target via the laser path control apparatus, can thereby control the relative positions of the pickup coil and the laser light and perform an inspection in an optimum magnetic field condition and also detect with high sensitivity even when the inspection target has a fine structure and magnetic field is generated at fine intervals.

Furthermore, as described above, when an optical fiber is used as the laser light guide member 12 (see FIG. 1), it is also possible to structurally simplify the laser light induction member. Furthermore, even when a hollow space is also used as part of the laser light guide member as in the case of the modification example shown in FIG. 4(B), there will be no influence from liquid nitrogen or the like.

Moreover, in the above described scanning laser SQUID microscope when a pickup coil is set up inside the liquid nitrogen container and laser light is irradiated onto the inspection target through the outside of the liquid nitrogen container, there is no need to let laser light pass through liquid nitrogen and it is possible to omit the optical fiber or the like and directly control the path.

Furthermore, the above embodiments have explained the optical apparatus with a condensing lens 14 on the precondition that the optical axis of the laser light 2 emitted from the laser path control section 102 is aligned in the vertical direction. However, since the direction in which the laser light 2 goes out of the laser path control section 102 may be sometimes inclined from the vertical direction, a configuration example which can also handle such a case will be shown below using FIG. 9(A).

Figure 9A:
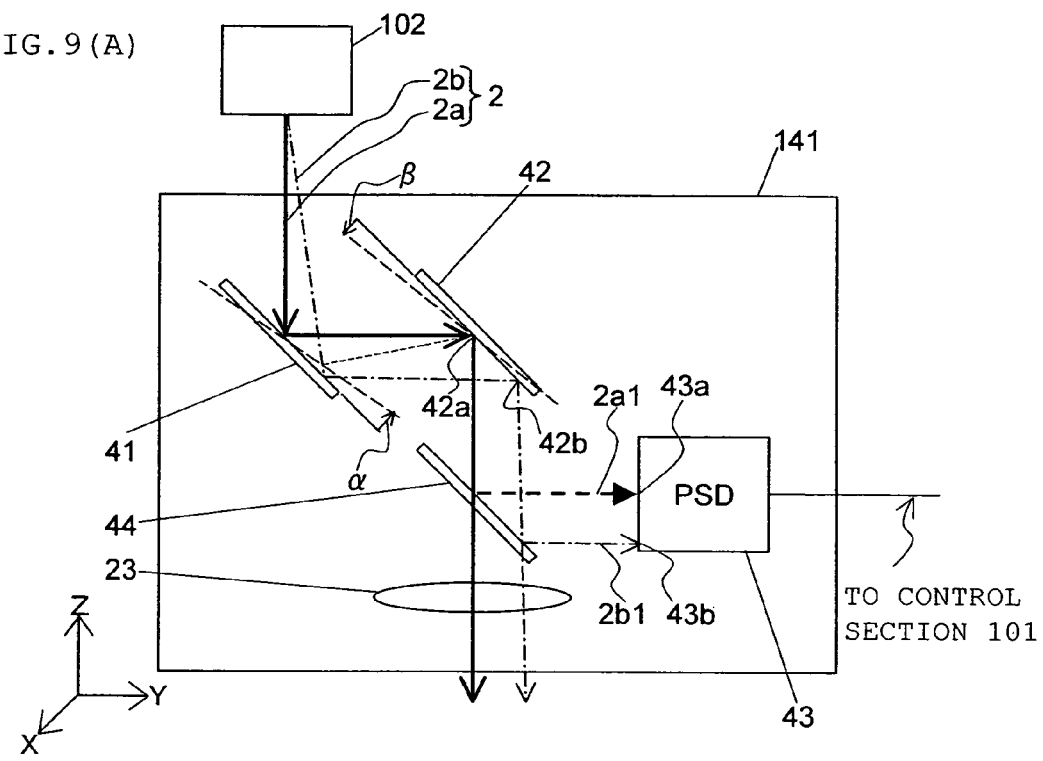
FIG. 9(A) is a conceptual diagram illustrating an optical apparatus with a condensing lens which allows the optical axis of laser light to be adjusted and FIG. 9(B) shows a path of laser light made after a first mirror and a second mirror rotate.

FIG. 9(A) is a conceptual diagram illustrating an optical apparatus with a condensing lens 141 for which it is possible to adjust the optical axis of laser light.

As shown in the same figure, a first rotatable mirror 41 and a second mirror 42 for reflecting laser light 2 emitted from a laser path control section 102 are provided inside the optical apparatus with a condensing lens 141. Furthermore, inside the optical apparatus with a condensing lens 141, there are also a splitter 44 which separates the laser light 2 into a path to a position detection sensor (PSD) 43 and a path to a condensing lens 23, a position detection sensor 43 and a condensing lens 23. The position detection sensor 43 is an instrument which detects the degree of inclination (amount of shift) of the laser light 2 emitted from the laser path control section 102 and outputs the detection result to the control section 101 (see FIG. 1). The control section 101 obtains the output from the position detection sensor 43 and controls the rotation angle of the first mirror 41 and the second mirror 42.

Next, with reference to FIG. 9(A) and FIG. 9(B), operation of each section will be explained. To facilitate an understanding of the explanation here, a case where an inclination of the laser light 2 occurs on the Y-Z plane will be explained, but the basic operation is the same as that described below even when an inclination occurs on the X-Z plane or in the X-Y-Z space.

First, the path of laser light 2a emitted vertically from the laser path control section 102 will be explained. In FIG. 9(A), the path in this case is shown by a solid line.

In the same figure, the laser light 2a is reflected by the first mirror 41, reflected by the position 42a which is the rotation center of the second mirror 42 and travels vertically downward in the figure. Moreover, laser light 2a1 turned to the right in the figure (shown by a dotted line in the figure) by the splitter 44 enters the position detection sensor 43 at a central position 43a, while the laser light which travels from the splitter 44 vertically straight downward in the figure enters the condensing lens 23 at the center of the lens.

Next, the path of laser light 2b emitted from the laser path control section 102 inclined by a certain angle will be explained using FIG. 9(A) and FIG. 9(B). In FIG. 9(A), the path of the laser light 2b is shown by a single-dot dashed line.

In FIG. 9(A), the laser light 2b is reflected by the first mirror 41, reflected at a position 42b which is shifted from the position 42a which is the rotation center of the second mirror 42 and travels downward. Laser light 2b1 which has been turned to the right by the splitter 44 enters at a position 43b which is shifted from the center position 43a of the position detection sensor 43.

On the other hand, the laser light which travels straight downward enters the condensing lens 23 at a position shifted from the lens center. The position detection sensor 43 which has detected the shift of the incident light outputs a signal according to the amount of shift to the control section 101. The control section 101 causes the first and second mirrors 41 and 42 to rotate by α degrees and β degrees respectively to reduce the amount of shift to 0. The reflected light of the laser light 2b after the first mirror 41 rotates by α degrees is shown by a dotted line. Here, the rotation angle (α degrees) of the first mirror 41 is controlled in such a way that the reflected light 2b shown by the dotted line always travels to the center position 42a of the rotation axis of the second mirror 42.

Figure 9B:
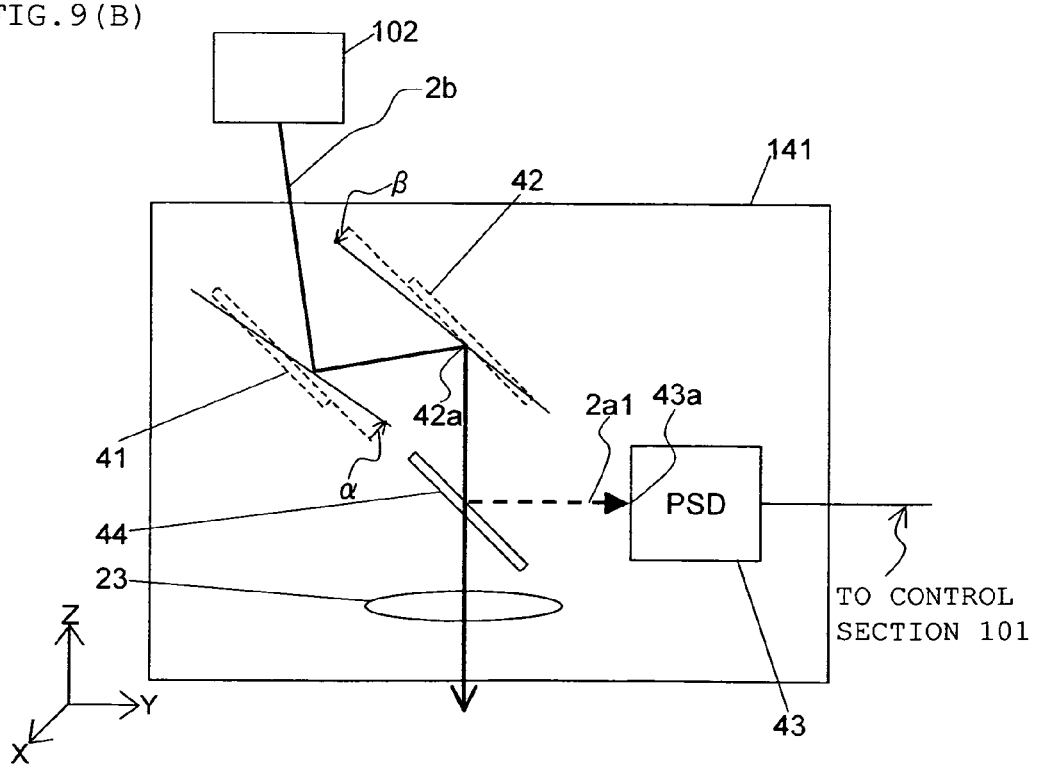
Figure 10:
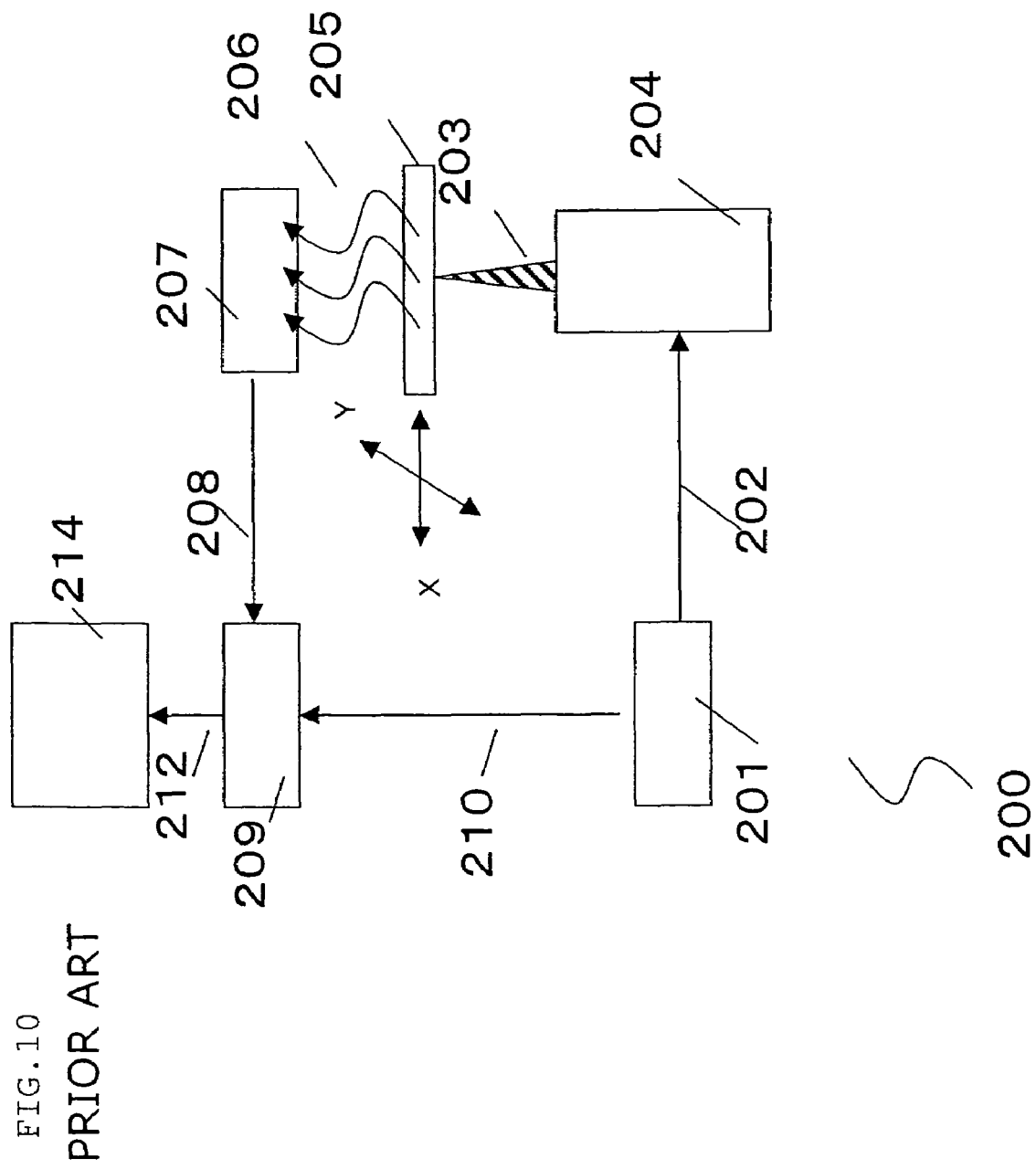
FIG. 10 is a block diagram showing the configuration of a conventional laser SQUID microscope.
Figure 11:
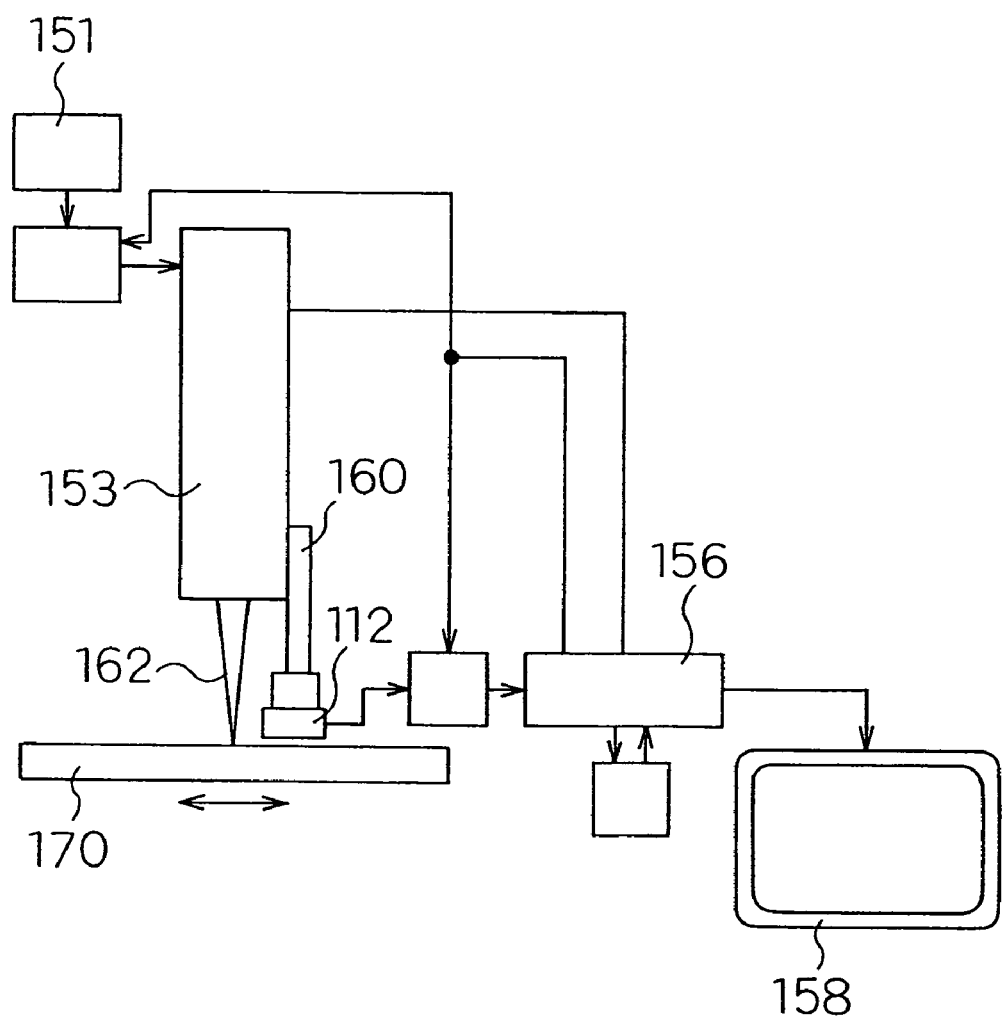
FIG. 11 is a conceptual diagram showing the configuration of another conventional laser SQUID microscope.
Figure 12A:
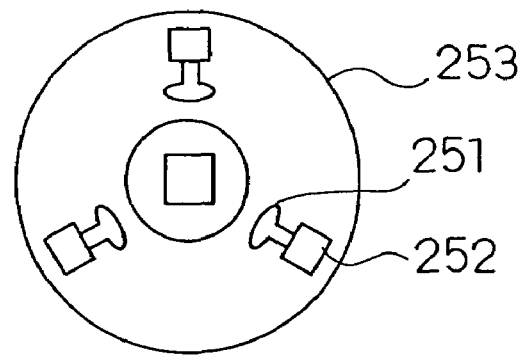
FIG. 12(A) is a conceptual diagram of still another conventional laser SQUID microscope viewed from top and FIG. 12(B) is a conceptual diagram of the laser SQUID microscope in FIG. 12(A) viewed from a side.
Figure 12B:
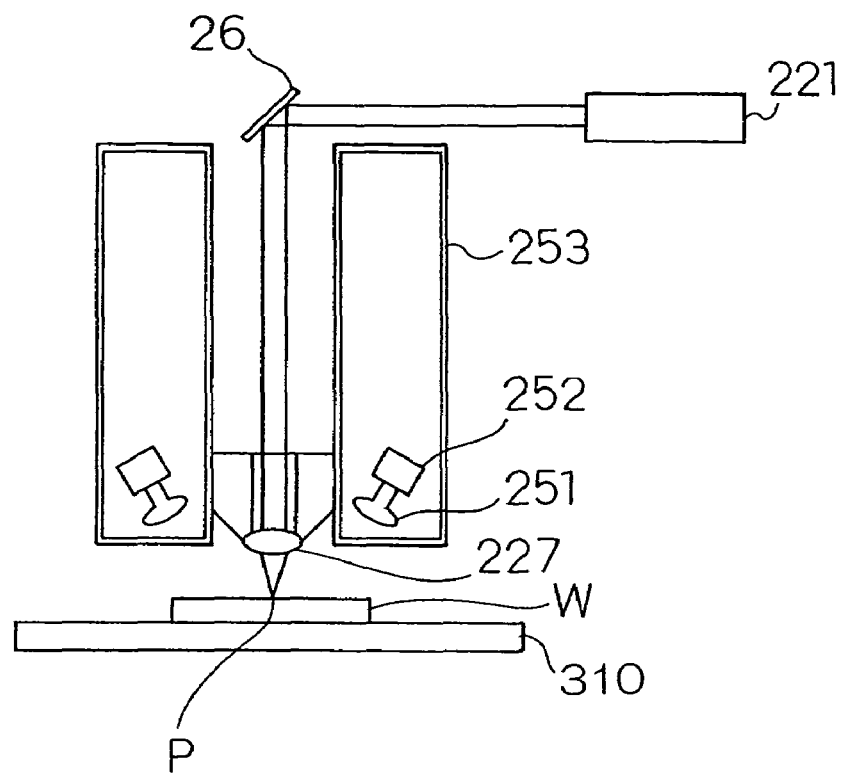

FIG. 9(B) shows the path of the laser light 2b after the first and second mirrors 41 and 42 rotate by α degrees and β degrees respectively with a solid line and a dotted line.

Even if the laser light 2 incident on the optical apparatus with a condensing lens 141 is inclined, this allows the laser light 2 to enter the condensing lens 23 at the center position of the lens.

The induced magnetic field detecting apparatus according to the present invention has the effect of being able to detect a feeble magnetic field with higher accuracy and is useful as an induced magnetic field detecting apparatus or the like.

What is claimed is:

1. An induced magnetic field detecting apparatus comprising:
- a stage which hold an inspection target;
- a laser light generation unit which generates laser light;
- a laser light irradiation unit for irradiating said laser light onto said inspection target held on said stages;
- a pickup coil for converting a magnetic field generated from said inspection target by said irradiated laser light to a current signal; and
- a SQUID magnetic field detection unit which outputs information on said magnetic field based on said current signal,
- wherein said laser light irradiation unit and said pickup coil are arranged on the same side as a position at which said inspection target is held relative to said stage and said pickup coil is disposed above the position of said inspection target onto which said laser light is irradiated and
- wherein said laser light irradiated from said laser light irradiation unit passes inside said pickup coil.

2. The induced magnetic field detecting apparatus according to claim 1, wherein said laser light irradiation unit comprises a condensing lens system which condenses said laser light and passes said laser light inside said pickup coil and a laser light induction unit for guiding the laser light from said laser light guide unit to said condensing lens system, and
- a whole or part of said laser light guide unit, said condensing lens system, said pickup coil and said SQUID magnetic field detection unit are accommodated in a container which contains liquid nitrogen.

3. The induced magnetic field detecting apparatus according to claim 1, wherein said laser light irradiation unit comprises a condensing lens system which condenses said laser light and passes said laser light inside said pickup coil and a laser light guide unit for guiding the laser light from said laser light generation unit to said condensing lens system,
- said pickup coil and said SQUID magnetic field detection unit are disposed in a container which contains liquid nitrogen, and
- said condensing lens system is disposed in a hollow space through which said laser light passes, said hollow space being provided in said container.

4. An induced magnetic field detecting apparatus comprising:
- a stage which holds an inspection target;
- a laser light generation unit which generates laser light;
- a laser light irradiation unit for irradiating said laser light onto said inspection target held on said stage;
- a pickup coil for converting a magnetic field generated from said inspection target by said irradiated laser light to a current signal; and
- a SQUID magnetic field detection unit which outputs information on said magnectic field based on said current signal,
- wherein said laser light irradiation unit and said pickup coil are arranged on the same side as a position at which said inspection target is held relative to said stage and said pickup coil is dispose above the position of said inspection target onto which said laser light is irradiated, said laser light irradiated from said laser light irradiation unit passes outside said pickup coil, said laser light irradiation unit comprises a condensing lens system which condenses said laser light and passes said laser light outside said pickup coil and a laser light guide unit for guiding said laser light from said laser light generation unit to said condensing lens system, and
- said pickup coil and said SQUID magnetic field detection unit are accommodated in a container which contains liquid nitrogen.

* * * * *

UNITED STATES PATENT AND TRADEMARK OFFICE
CERTIFICATE OF CORRECTION

PATENT NO.         : 7,463,025 B2
APPLICATION NO. : 11/562649
DATED                 : December 9, 2008
INVENTOR(S)        : Shinsuke Komatsu It is certified that error appears in the above-identified patent and that said Letters Patent is hereby corrected as shown below:

In claim 1 of the Letters Patent, at column 15, line 7, "on said stages;" should read -- on said stage; --

In claim 4 of the Letters Patent, at column 16, line 23, "is dispose above" should read -- is disposed above --

Signed and Sealed this

Second Day of June, 2009

JOHN DOLL
*Acting Director of the United States Patent and Trademark Office*